United States Patent
Chou et al.

(10) Patent No.: US 8,192,669 B2
(45) Date of Patent: Jun. 5, 2012

(54) METHODS FOR FABRICATING LARGE AREA NANOIMPRINT MOLDS

(76) Inventors: Stephen Y. Chou, Princeton, NJ (US); Can Peng, Houston, TX (US); Wendi Li, Princeton, NJ (US); Shufeng Bai, Foster City, CA (US)

( * ) Notice: Subject to any disclaimer, the term of this patent is extended or adjusted under 35 U.S.C. 154(b) by 0 days.

(21) Appl. No.: 12/473,115

(22) Filed: May 27, 2009

(65) Prior Publication Data

US 2010/0078855 A1 Apr. 1, 2010

Related U.S. Application Data

(60) Provisional application No. 61/056,319, filed on May 27, 2008.

(51) Int. Cl.
  *B28B 11/08* (2006.01)
  *B29C 59/00* (2006.01)
(52) U.S. Cl. ........................ 264/293; 977/887
(58) Field of Classification Search .............. 977/887; 264/293
  See application file for complete search history.

(56) References Cited

U.S. PATENT DOCUMENTS

| | | | |
|---|---|---|---|
| 7,419,764 B2* | 9/2008 | Park et al. ............... | 430/296 |
| 2002/0127495 A1* | 9/2002 | Scherer .................. | 430/314 |
| 2003/0170996 A1* | 9/2003 | Chou ..................... | 438/706 |
| 2004/0082178 A1* | 4/2004 | Kamins et al. ........... | 438/691 |
| 2005/0159019 A1* | 7/2005 | Lee ...................... | 438/800 |
| 2005/0218112 A1* | 10/2005 | Marty et al. ............ | 216/41 |
| 2006/0119853 A1* | 6/2006 | Baumberg et al. ......... | 356/445 |
| 2007/0031505 A1* | 2/2007 | Roy et al. .............. | 424/490 |
| 2007/0177139 A1* | 8/2007 | Kamins et al. ........... | 356/301 |
| 2007/0228583 A1* | 10/2007 | Islam et al. ............ | 257/784 |
| 2008/0067721 A1* | 3/2008 | Yu et al. ............... | 264/349 |
| 2008/0094621 A1* | 4/2008 | Li et al. ............... | 356/301 |
| 2008/0187719 A1* | 8/2008 | Uchida .................. | 428/156 |

OTHER PUBLICATIONS

Fleischmann, M.; Hendra, P. J.; McQuillan, A.J., "Raman Spectra of Pyridine Adsorbed at a Silver Electrode", Chemical Physics Letters 1974, 26 (2), 163-166.

Zhao, L. L; Jensen, L.; Schatz, G.C., "Surface-Enhanced Raman Scattering of Pyrazine at the Junction between Two AG$_{20}$ Nanoclusters", Nano Letters 2006; vol. 6, pp. 1229-1234.

Schuck, P.J.; Fromm D. P.; Sundaramurthy, A.; Kino, G.S.; Moerner, W.E., "Improving the Mismatch between Light and Nanoscale Objects with Gold Bowtie Nanoantennas", Physical Review Letters 2005, vol. 94, pp. 017402.

Chou, S.Y.; Grauss, P.R.; Renstom, P.J., "Imprint of sub-25 nm vias and trenches in polymers", Applied Physics Letters, 1995 vol. 67 (21), pp. 3114-3116.

Chou, S.Y.; Grauss, P.R.; Renstom, P.J., "Imprint Lithography with 25-Nanometer Resolution", Science, 1996 vol. 272 (5258), pp. 85-87.

(Continued)

*Primary Examiner* — Yogendra Gupta
*Assistant Examiner* — Jeremiah Smith
(74) *Attorney, Agent, or Firm* — Polster, Lieder, Woodruff & Lucchesi, L.C.

(57) ABSTRACT

This invention relates to the fabrication of large area nanoimprint molds having complex patterns with minimal or no use of direct-writing, such as electron beam lithography, ion, laser beam, or mechanical beam lithography. This can be accomplished by forming a pattern of simple nanoscale features and converting the simple features into more complex nanoscale features by a process comprising shadow deposition. The process may also include steps of uniform deposition, etching and smoothing depending on the shape of the complex features.

26 Claims, 10 Drawing Sheets

OTHER PUBLICATIONS

Austin. M.D.; Zhang, W.; GE, H. X.; Wasserman, D.; Lyon, S.A.; Chou, S.Y., "6 nm half-pitch lines and 0.04 micrometer^2 static random access memory patterns by nanoimprint lithography", Nanotechnology 2005, vol. 16 (8), pp. 1058-1061.

Mrozek, I.; Otto, A., "Quantitative Separation of the classical electromagnetic and the chemical contribution to surface enhanced Raman scattering", Journal of Electron Spectroscopy and Related Phenomena 1990, vol. 54, pp. 895-911

Fromm, D.P.; Sundaramurthy, A.; Kinkhabwala, A.; Schuck, P.J.; Kino, G.S.; Moerner, W.E., "Exploring the chemical enhancements for surface-enhanced Raman scattering with Au bowtie nanoantennas", Journal of Chemical Physics 2006, vol. 124 (6).

Hicks, E.M.; Lyandres, O.; Hall, W.P.; Zou, S.L.; Glucksberg, M.R.; Van Duyne, R.P., "Plasmonic Properties of Anchored Nanoparticles Fabricated by Reactive Ion Etching and Nanosphere Lithography",Journal of Physical Chemistry C 2007, vol. 111 (11), pp. 4116-4124.

Austin, M.D.; GE, H.X.; Wu, W.; Li, M.T.; Yu, Z.N.; Wasserman, D.; Lyon, S.A.; Chou, S.Y., "Fabrication of 5 nm linewidth and 14 nm pitch features by nanoimprint lithography", Applied Physics Letters 2004, vol. 84 (26), pp. 5299-5301.

Wu, W.; Cui, B.; Sun, X.Y.; Zhang, W.; Zhuang, L.; Kong, L.S.; Chou, S.Y., "Large area high density quantized magnetic disks fabricated using nanoimprint lithography", Journal of Vacuum Science and Technology B 1998, vol. 16 (6), 3825-3829.

* cited by examiner (a)

(b)

METHODS FOR FABRICATING LARGE AREA NANOIMPRINT MOLDS

CROSS-REFERENCE TO RELATED APPLICATIONS

This application claims the benefit of Provisional Application No. 61/056,319 filed on May 27, 2008, which is incorporated herein by reference. This application is also related to U.S. application Ser. No. 10/140,140 filed May 7, 2002, (now U.S. Pat. No. 7,137,803, issued to Stephen Y. Chou on Nov. 21, 2006) and to U.S. application Ser. No. 11/442,900 filed on May 29, 2006 (now U.S. Pat. No. 7,282,456 issued to Stephen Y. Chou, et al. on Oct. 16, 2007), both of which are herein incorporated by reference.

STATEMENT REGARDING FEDERALLY SPONSORED RESEARCH

Not Applicable.

BACKGROUND OF THE INVENTION

This invention relates to the fabrication of large area nanoimprint molds with complex patterns with minimal or no use of direct-writing, such as electron beam lithography, ion, laser beam, or mechanical beam lithography.

The key challenges in the fabrication of Surface-Enhanced Raman Scattering (SERS) nanostructures for research and broad applications are to develop nanofabrication technologies that not only can produce smaller SERS nanostructures, but also can produce these nanostructures reliably, with fast turn-around time and over large areas.

The current fabrication approaches cannot meet current needs. Most previous fabrications of nanoantennas have used electron-beam lithography (EBL). Some work has used nanosphere lithography to achieve bowtie structures. EBL offers the capability to write a computer-designed pattern to a substrate and can make structures in the 5 nm range. However, as the feature size gets below 30 nm, not all EBL tools and processes can be used, and the fabrication reliability and throughput are significantly reduced. Nanoscale EBL patterning is limited to an area much less than 1 mm$^2$ area—an area too small to be used as a nanoimprint lithography (NIL) mold. The Table.3B-1 of Appendix 1 shows the time needed for EBL to write arrays of bowtie nanoantennas (with 80 nm ×80 nm triangle pairs, 20 nm gap, and 200 nm and 1 µm pitch) for a 1" or 6" wafer. For high resolution patterns, the EBL resists needed (typically PMMA 996K and ZEP520A) are slow. For 20 pA current (needed for smaller beam diameter) it takes about 3 days for writing even 1 µm pitch nanoantenna arrays on a 1" wafer. Clearly this method is impractical for large-area SERS applications.

Nanosphere lithography has the capability to pattern large areas efficiently, however the controllability and reliability of the pattern positioning are poor. Furthermore the only a limited range of geometric profiles can be patterned by nanosphere lithography.

We have determined that for research scale areas we can speed up the nanofabrication process by using EBL to make a nanoimprint mold, and then use nanoimprint lithography (NIL) to do fast-turn around duplication, rather than use EBL for every nanoantenna fabrication run. It is to be noted that frequently one needs several or 10's of EBL runs to get a single good mold for the required feature scales. However, for larger area applications, there exists a need for further innovative technologies to pattern large-area nanoimprint molds without using EBL.

SUMMARY OF THE INVENTION

This invention relates to the fabrication of large area nanoimprint molds having complex patterns with minimal or no use of direct-writing, such as electron beam lithography, ion, laser beam, or mechanical beam lithography. This can be accomplished by forming a pattern of simple nanoscale features and converting the simple features into more complex nanoscale features by a process comprising shadow deposition. The process may also include steps of uniform deposition, etching and smoothing depending on the shape of the complex features.

BRIEF DESCRIPTION OF THE DRAWINGS

The advantages, nature and various additional features of the invention will appear more fully upon consideration of the illustrative embodiments now to be described in detail in connection with accompanying drawings. In the drawings.

It is to be understood that these drawings are for the purpose of illustrating the concepts of the invention and accept for photographs are not to scale.

DETAILED DESCRIPTION OF THE INVENTION

Nanofabrication with Fine Feature Size, High Precision and Fast Turnaround

To meet the needs of high resolution and fast turnaround nanopatterning for

SERS research and applications, we propose the use nanoimprint as a major approach to duplicate the SERS patterns with molds fabricated by either direct writing or by other innovative methods that do not need direct writing. Our innovative methods can create SERS nanoimprint molds over large areas (6" wafers), and can create very small feature sizes with good dimension control.

The reason for avoiding direct-write EBL in producing SERS nanostructures is that as the feature size becomes smaller, the reliability and dimension control of EBL becomes very poor and throughput drops drastically. Hence, multiple runs are required to obtain one good sample. In contrast, once a good nanoimprinting mold is made (the original or "master" mold), each NIL duplication will faithfully reproduce the exact pattern on the mold with a resolution better than 2 nm (Appendix 1 References 5, 6, 10). The master mold also can be used to create identical "daughter" molds to use in parallel and to further reduce the fabrication time and cost while speeding up the fabrication process. For example, to study the effect of the choice of metal used for the same nanoantenna geometry, we can use nanoimprint to create different metal samples rather than use the repeated electron-beam writing in which the variations in electron beam writing can obscure the study of the material itself.

Figure 1A:
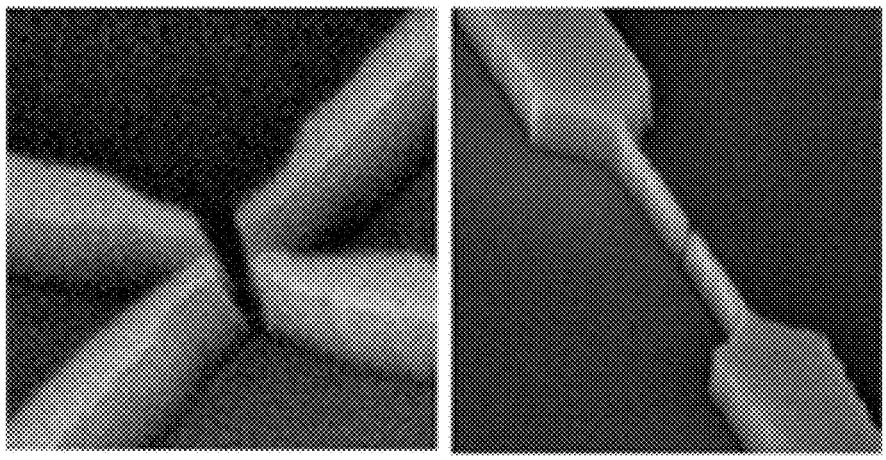
FIGS. 1a-1c illustrates 5 nm resolution photocurable nanoimprint lithography with application for single-molecule contacts. (a) depicts SEM images of a silicon oxide mold. (b) depicts SEM images of the imprinted P-NIL resist after UV curing and mold separation. Mold features as small as 5 nm were reliably reproduced in the resist. (c) depicts SEM images of Au contacts after evaporation of metal and lift-off of the resist. Contact gaps as narrow as 5 nm can be fabricated.
Figure 1B:
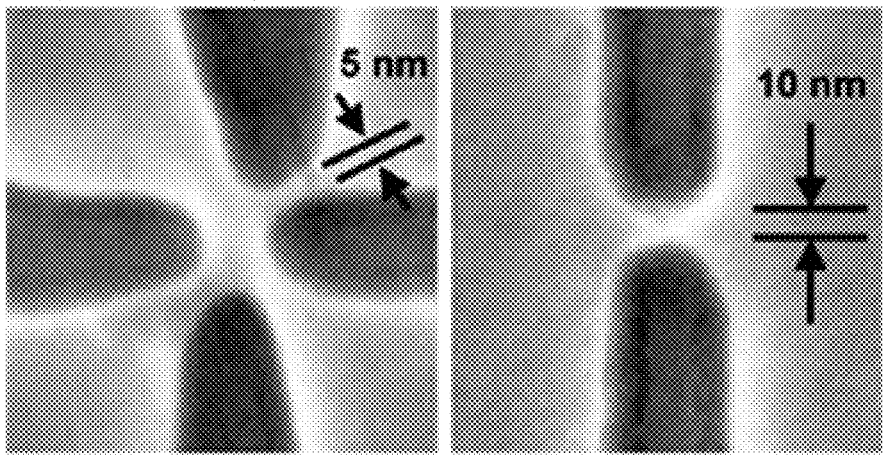
Figure 1C:
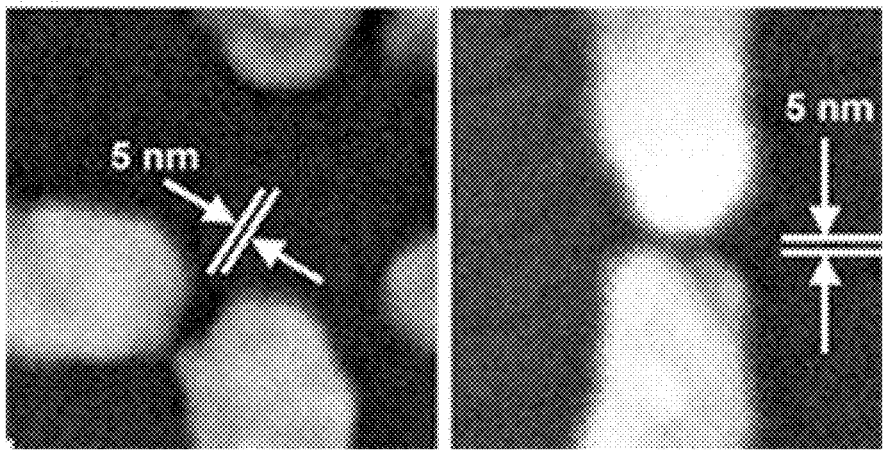

FIG. 1 shows a nanoimprint mold and Au nanostructures with gaps of 5 nm that we fabricated by using nanoimprint and lift-off with sub-2 nm resolution (6). This demonstrates the precision patterning attainable.

Large-Area Mold Fabrication Without Electron-Beam Lithography

One of the Achilles heels of large area SERS nanostructures (and other meta-materials that need lithographically patterned nanostructures) is that EBL is too slow to make even an area larger than 1 $mm^2$. Nanoimprint is known have a high throughput in duplication, but it requires a mold, often written by EBL. We have solved this problem by developing an innovative approach that allows us to make large-area nanostructure molds with complex patterns such as bowties, split rings, and others without using electron-beam lithography. The heart of this new fabrication process, which we call fabrication by multiple-nanoimprint and shadow-evaporation (FMS), is the unique combination of multiple nanoimprint steps with edge definition and shadow evaporation to form the final mold (Chou, et al, EIPBN 2007 and NNT2007). Using FMS, both bowtie and split-ring (single split or double splits) large area molds can be made.

Large Area Bowtie Mold

Figures 2A, 2B, 2C, 2D, 2E, 2F, 2G, 2H:
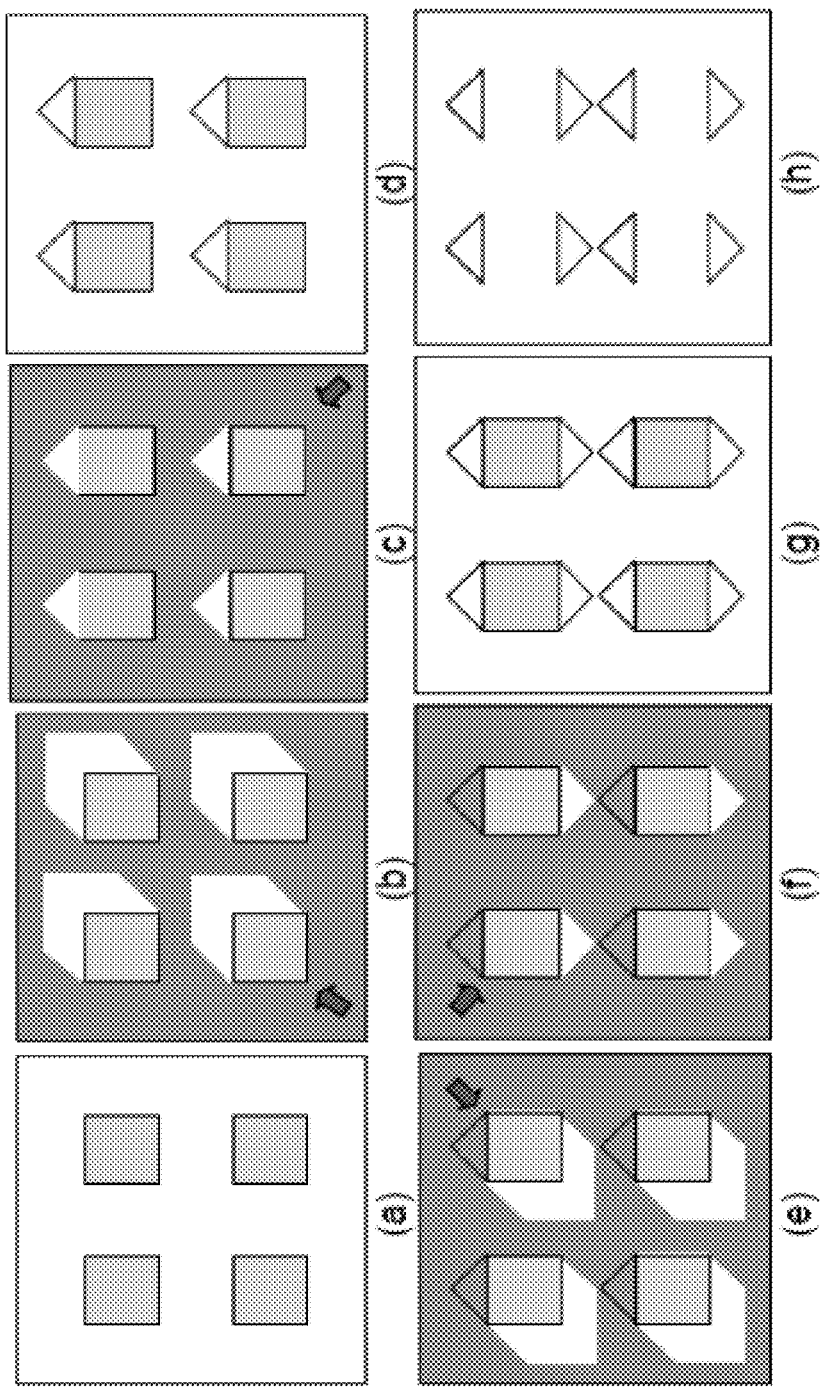
FIGS. 2a-2h illustrates effects of different depositions on pillars with simple square cross-sections: (a) shows a duplicate square resist pillars; (b) shows $1^{st}$ oblique shadow evaporation of Cr (the arrow shows the evaporation direction); (c) shows $2^{nd}$ oblique shadow evaporation of Cr from another direction (as the arrow shows); (d) shows the transfer pattern with Cr removed; (e) shows $3^{rd}$ oblique shadow evaporation of Cr from the direction shown by the arrow; (f) shows $4^{th}$ oblique shadow evaporation from the direction shown by the arrow; (g) shows the transfer pattern with Cr removed and; (h) shows the resist pillar removed obtaining a mold of nanostructures having a more complex "bowtie" cross-section.

We start with a large area 2D square-pillar mold (made by double imprinting and processing of a 1D mold 11 [Chou, et al, 1998], currently 4" wafer and can be scaled to 6" wafer) to create bow tie patterns (FIG. 2). Specifically, we use the 2D pillar mold to create a bowtie daughter mold by multiple nanoimprint and multiple shadow evaporations. The first imprint is done by a 2D square-pillar mold to create a 2D square-pillar resist profile on the daughter mold substrate. Then a shadow evaporation of Cr from one diagonal direction, followed by thee more shadow evaporation steps from the remaining three diagonal directions forms a bowtie shaped gap on the daughter mold substrate. Reactive Ion Etching (RIE) is used to etch bowtie patterns into the daughter mold. After removing the Cr and resist, the bowtie mold is ready to use in fast-turnaround nanoimprint fabrication.

Large Area Single Split-Ring Mold

Figures 3A, 3B, 3C, 3D, 3E, 3F:
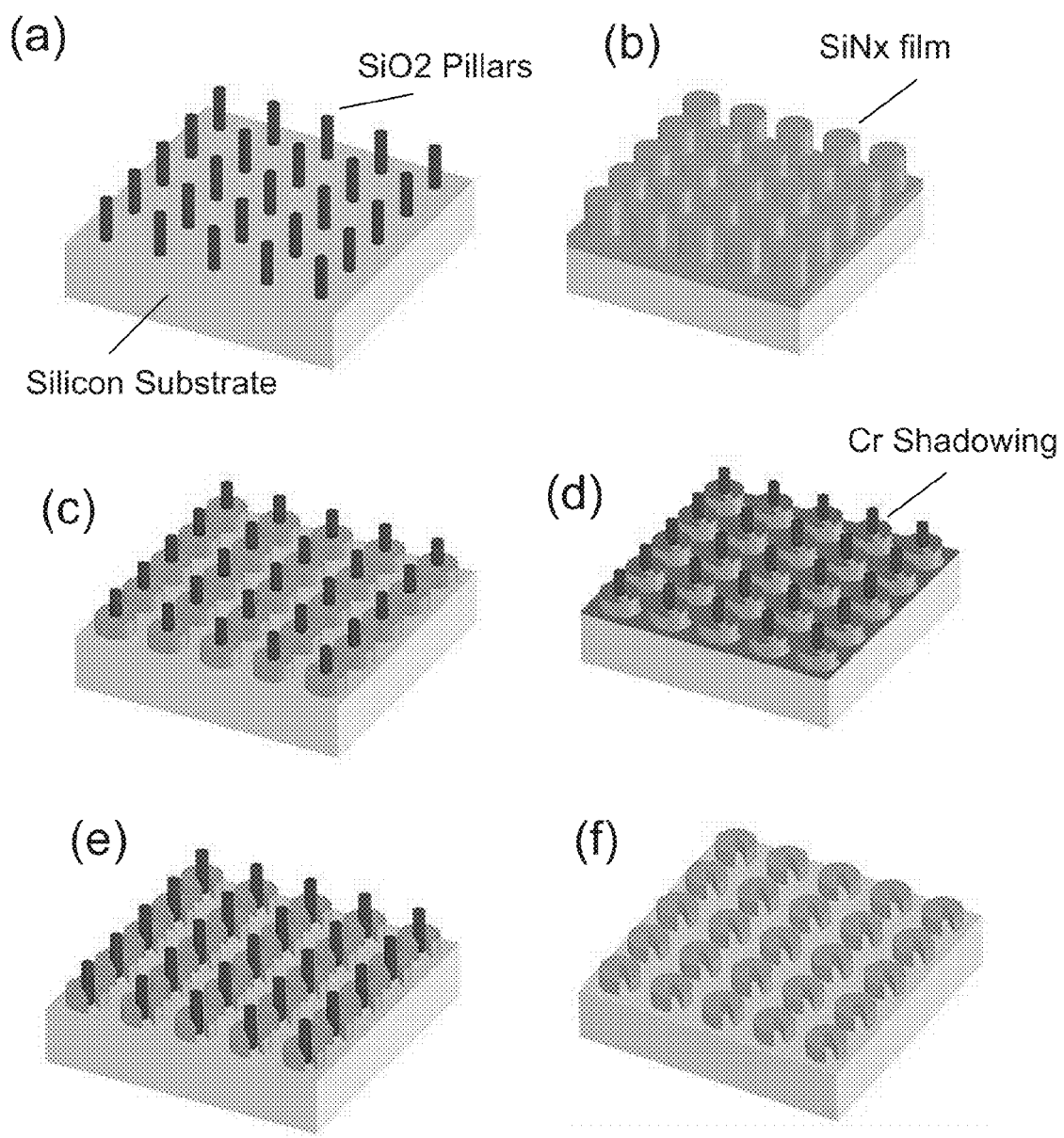
FIGS. 3a-3f illustrate stages of a fabrication process to make a nanoimprint mold for split-ring devices: (a) SiO$_2$ pillars with simple round cross-sections are fabricated by interference lithography and nanoimprint; (b) shows conformal SiNx growth over the pillars fabricated in (a); (c) illustrates etching down SiNx by reactive ion etching to expose the SiO$_2$ pillar as shadow mask; (d) illustrates oblique evaporation of Cr using the SiO$_2$ pillar as shadow mask; (e) shows etching into shadowed SiNx to make a cut on the SiNx ring; and (f) illustrates removal of SiO$_2$ pillar by HF.
Figures 4A, 4B, 4C:
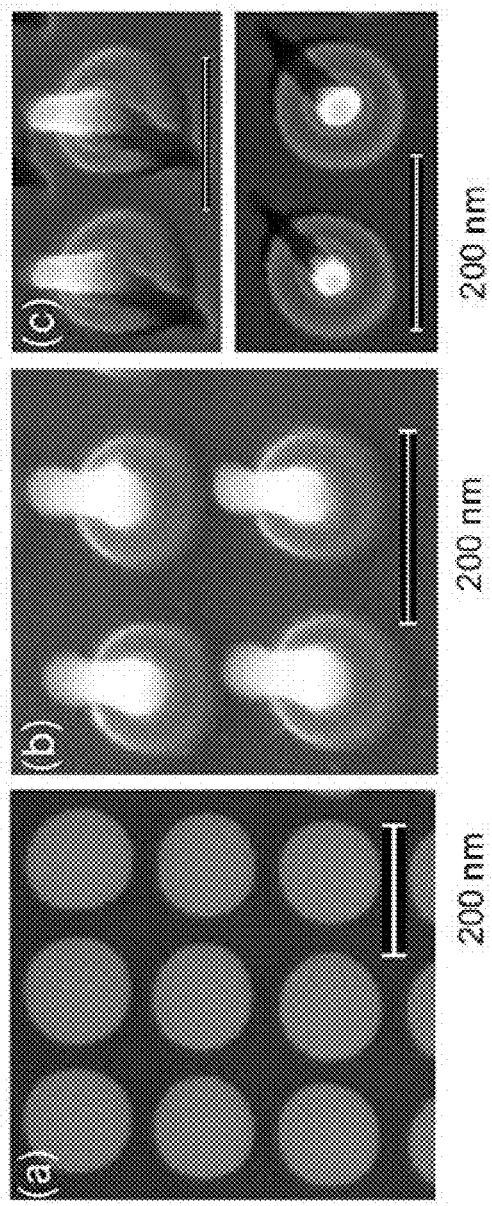
FIGS. 4a-4c illustrates SEMs of split-ring fabrication. (a) shows conformal SiNx deposition; (b) illustrates selectively etching down SiNx to expose SiO$_2$ pillar; (c) shows a single cut on the surrounding SiNx ring.

Split ring mold fabrication starts with a 2D round-pillar array master mold (FIG. 3), used to create a daughter mold with $SiO_2$ pillars on a silicon substrate by imprinting and etching. Then SiNx is deposited uniformly over the entire sample and anisotropic Reactive Ion Etching (RIE) is used to etch the SiNx, vertically until only the SiNx sidewall remains. Then Cr is shadow evaporated at an angle, which forms a gap in the Cr layer by covering the sample with Cr except for the small area behind each $SiO_2$ pillar. Then RIE is used to transfer the gap from Cr to SiNx, cutting the SiNx ring. After removing the $SiO_2$ pillars and Cr, the split-ring daughter mold is ready for use. The gap in Cr can be narrowed by an additional Cr shadow at a slightly different orientation. FIG. 4 shows the experimental results of the split-ring mold fabrication process.

Large Area Double Split-Ring Mold

Figures 5A, 5B, 5C, 5D, 5E, 5F:
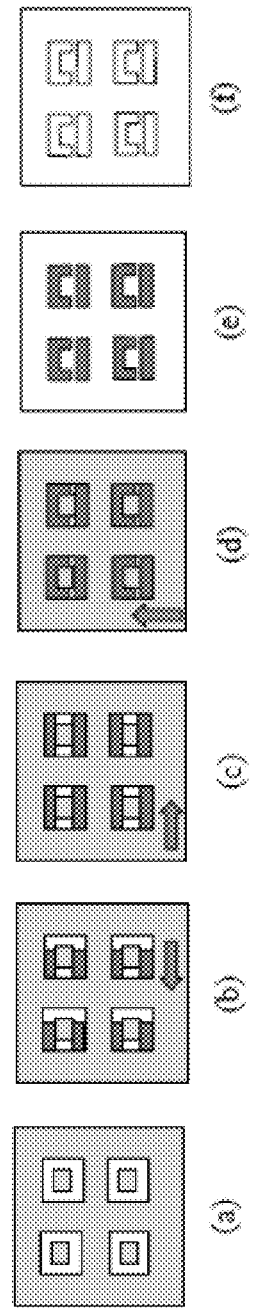
FIGS. 5a-5f illustrates fabrication of complex nanostructures with cross-sections in the form of double split-rings: (a) shows imprinted resist by a square ring mold; (b) illustrates Cr pattern (gray part) after the $1^{st}$ shadow evaporation (the arrow shows the shadow direction); (c) shows Cr pattern after the $2^{nd}$ shadow evaporation (the arrow shows the shadow direction); (d) illustrates Cr pattern after the $3^{rd}$ shadow evaporation (the arrow shows the shadow direction); (e) shows the Cr pattern on the substrate after lift-off; (f) illustrates transfer of the pattern into substrate to obtain a mold with double split-ring features.
Figure 6A:
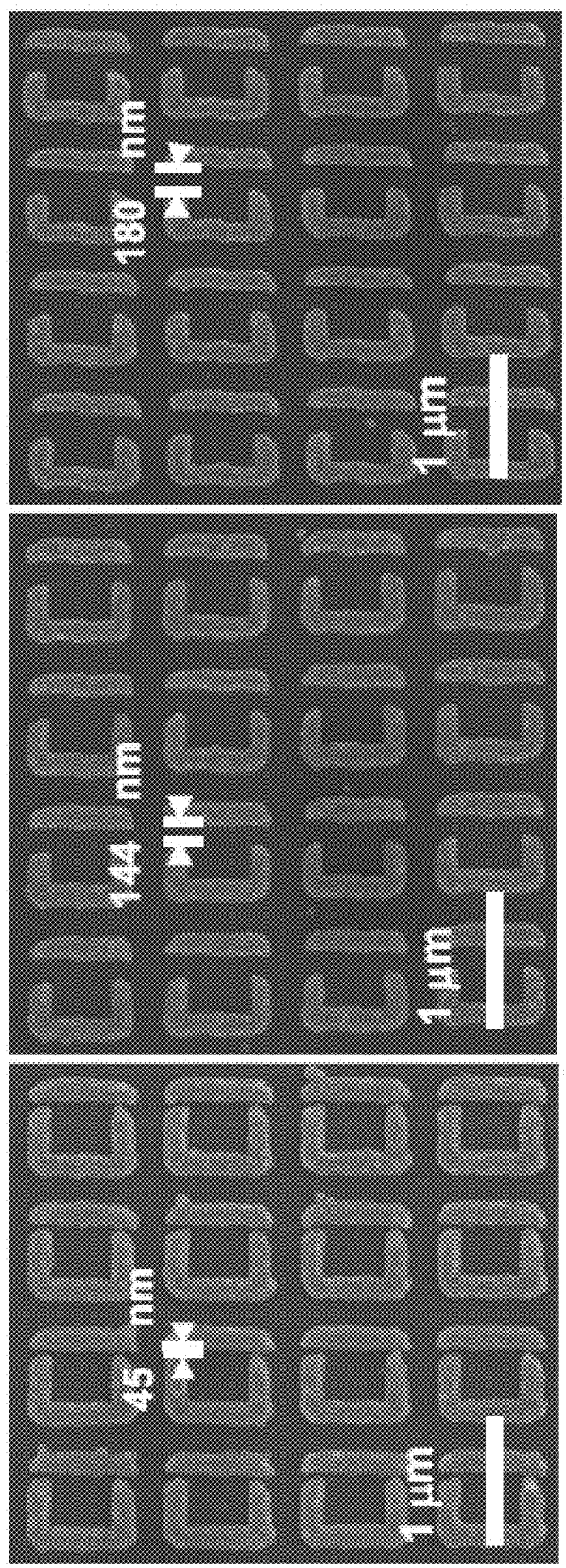
FIGS. 6a-6e relate to double split-rings: (a) shows SEM images of double split gold ring arrays with different gap sized duplicated by nanoimprint lithography from double split ring molds; (b) is a graph showing the transmission spectrum of whole gold rings; (c) is a graph showing transmission spectra of split rings for two orthogonal polarizations (one is along the symmetric axis of split rings, another is along the asymmetric axis); (d) is a graph showing transmission spectra of gold split rings with different gap sizes for polarization that is along the symmetric axis of split rings; (e) graphically illustrates transmission spectra of gold split rings with different gap sizes for polarization that is along the asymmetric axis of split rings.
Figure 6B:
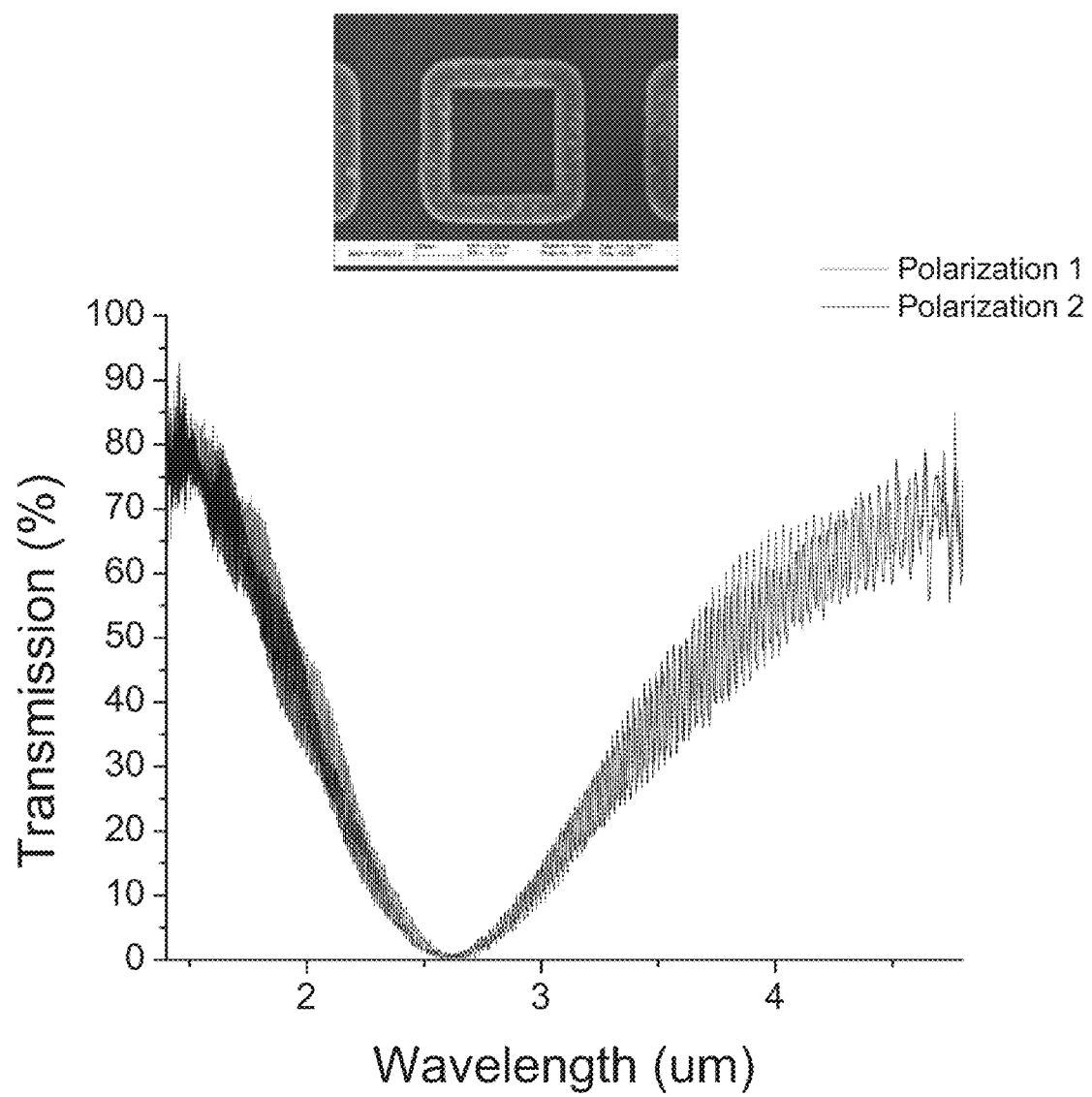
Figure 6C:
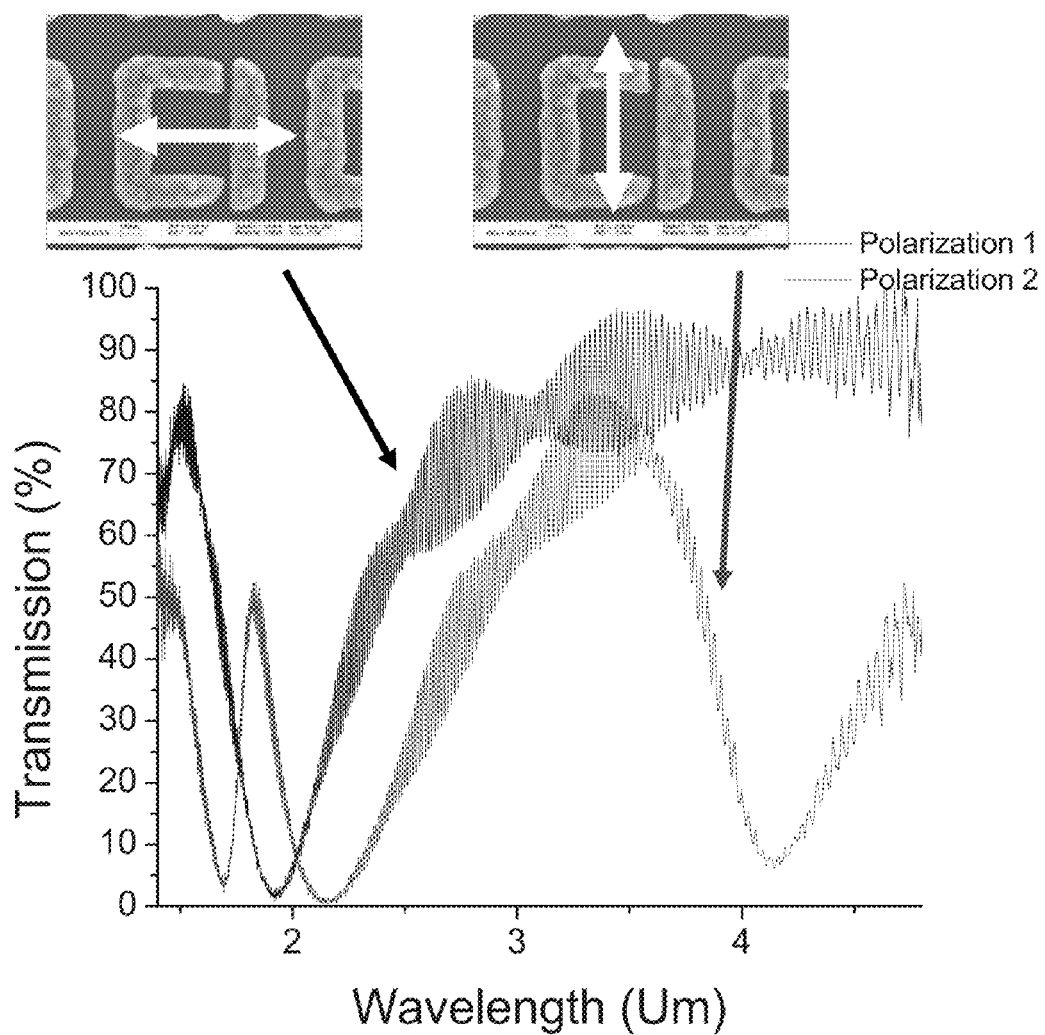
Figure 6D:
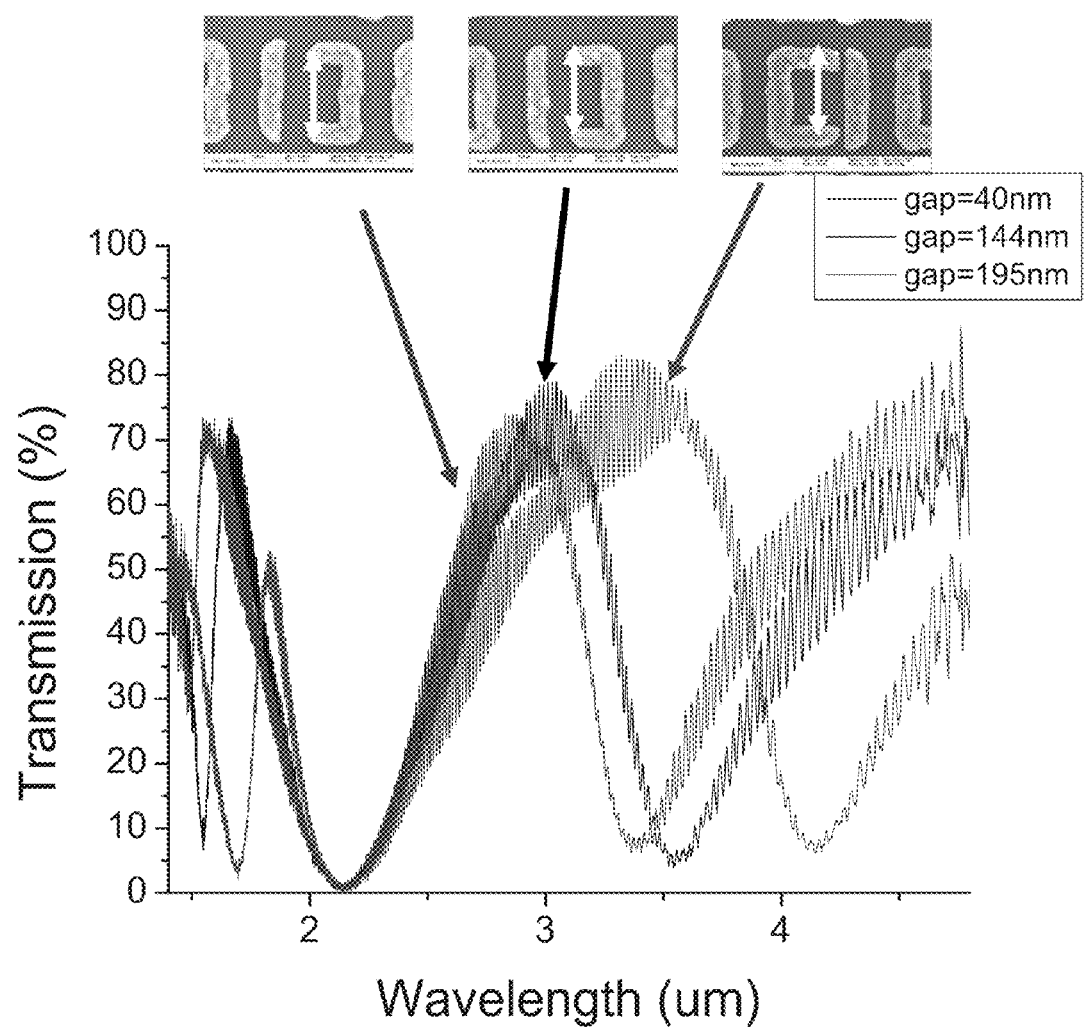
Figure 6E:
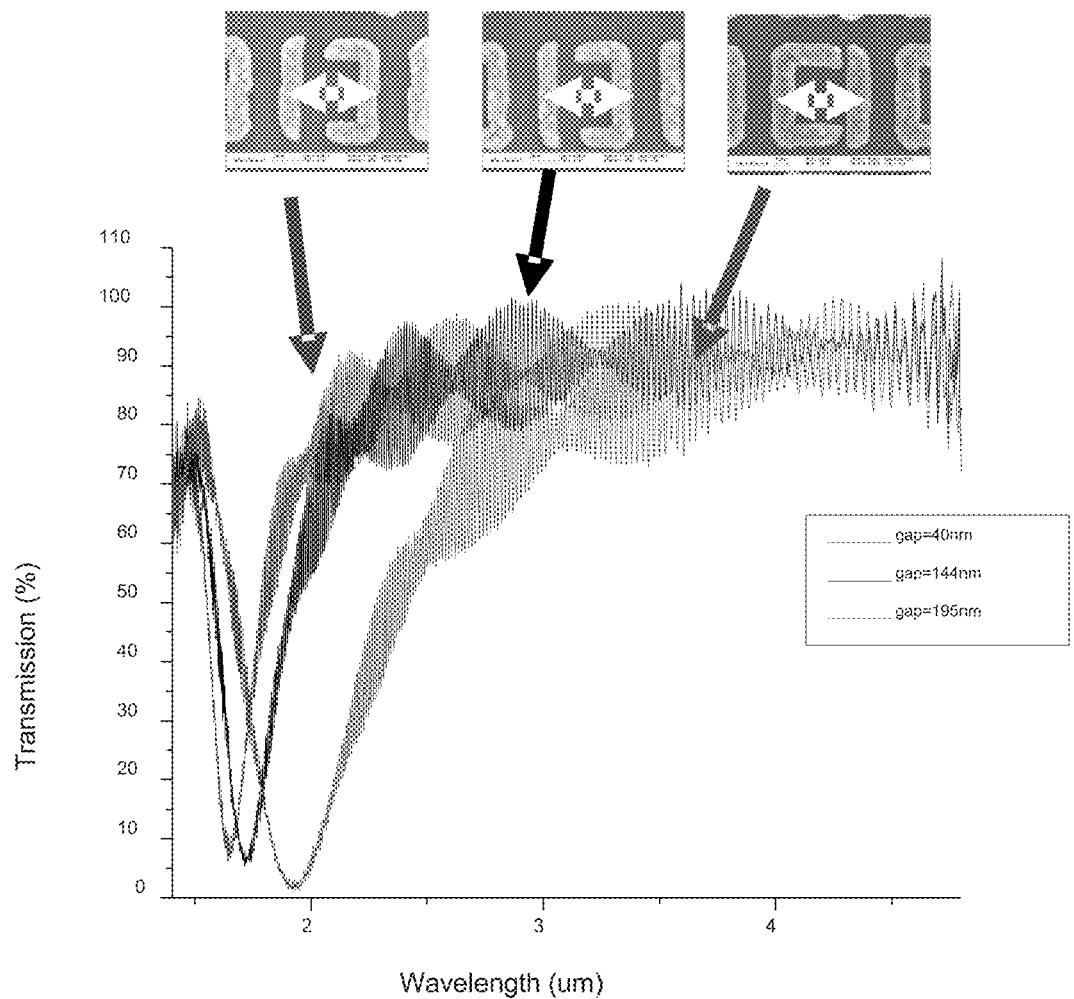

The mold fabrication for double split rings (FIG. 5) starts with a 2D square-pillar array mold, which is used to make a 2D square-pillar array in $SiO_2$ on a Si substrate. Then SiNx is deposited uniformly over the entire sample and isotropic RIE is used to etch the SiNx, until only the SiNx sidewall remains. When the $SiO_2$ pillars are removed, the SiNx square sidewall is left, forming the ring pattern that we use as a mold to imprint resist on a new $SiO_2$ substrate. We then shadow Cr in three different orthogonal directions in three separate runs, covering the sample with Cr except for two gaps. RIE is used to transfer the gaps in Cr to the $SiO_2$. After stripping the resist and Cr, a double-split ring array mold is formed. FIG. 5 shows the fabrication steps and optical characterization of Au double split-ring devices fabricated from our molds. FIG. 3B-6 shows the experimental results and measurements of resonant frequencies.

Smaller Gap in Fabrications of Bowtie and Split Rings

From the above description, it is clear that the gaps for bowtie and split-rings can be controlled by controlling the metal shadow evaporation angle. It is believed that we can obtain gaps 5 nm and smaller. One advantage of nanoimprint is that time invested in getting a good mold pays many returns since duplication by nanoimprint is high fidelity and high yield.

Self-Perfection to Reduce Fabrication Defects and To Increase Q-Factor

Figure 7A:
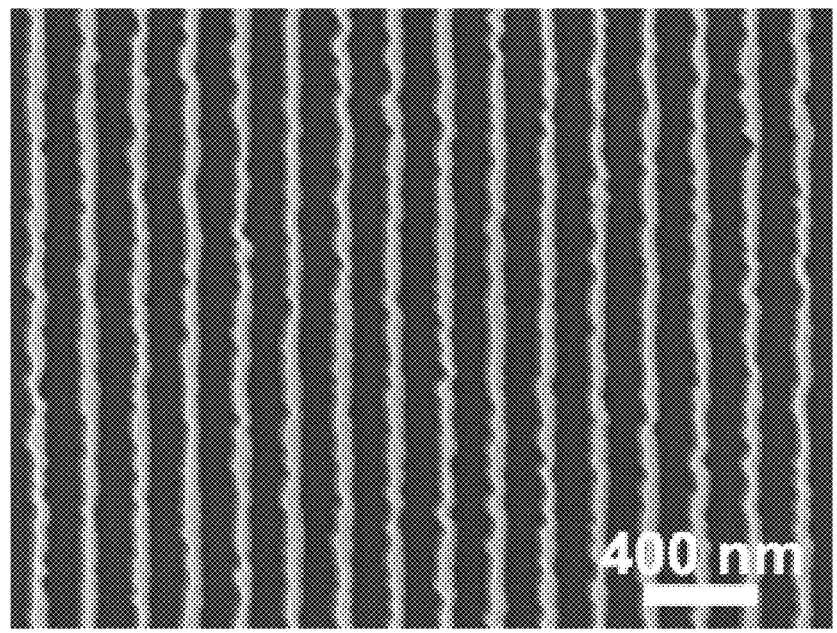
FIGS. 7a-7b illustrate the effect of smoothing: (a) shows 60 nm Si lines with the zig-zag edges on $SiO_2$ substrate before SPEL and (b) shows how they are smoothed out by SPEL.
Figure 7B:
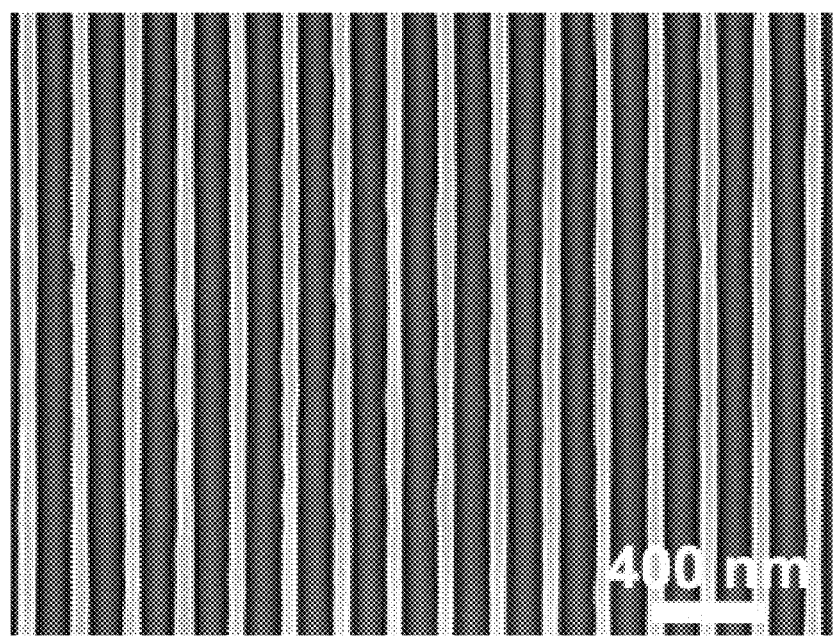

Since the bowtie and split-ring Nan antennas work at on resonance, a high Q-factor is essential to achieving high local optical field enhancement. From the fabrication point of view, the roughness on the surface of the device will reduce the Q-factor significantly, especially in nanoscale devices. Surface scattering of electrons induced by surface roughness will introduce additional resistance to the oscillating current inside the metallic structure, lowering the Q-factor. There are several ways to reduce the surface roughness. First, we can smooth our imprint mold. The self-perfection technique we have developed has demonstrated the ability to reduce the surface roughness of sub-20 nm feature sizes and over large substrate areas (See FIG. 7 and attached paper). This technique can be modified and improved for our split-ring and bow-tie nanoantenna structures. Second, the device design including geometric dimensions, profiles and materials also influence the Q-factor. For further details of the design and fabrication of such large area nanostructures see Appendices 1 and 2 and the reference papers cited at page 17 of Appendix 1, which papers are incorporated herein by reference.

It can now be seen that in one aspect the invention is a method of fabricating a mold having a pattern of nanoscale features of relatively complex geometrical cross-section (e.g. split rings, "bowties," and double-split rings). In essence, the methods comprise providing a substrate having a surface coated with resist material, forming a pattern of nanoscale features of relatively simple cross-section (e.g. square or round pillars) on the surface, and converting the simple nanoscale features into the complex nanoscale features by a process comprising shadow deposition of material on the substrate surface. In a preferred embodiment, the pattern of simple nanoscale features can comprise an array of square cross-section pillars and the shadow deposition can comprise a plurality of shadow evaporations (e.g. metal such as Cr) directed diagonally towards the pillar squares. In another advantageous embodiment, the simple nanoscale features can be an array of pillars with round cross-sections and the converting into complex nanoscale features can comprise coating, etching, and shadow evaporation to form nanostructures with more complex cross-sections.

The pattern of simple nanoscale features on the substrate surface can be formed by nanoimprint lithography or by direct writing such as electron beam lithography. The mold of complex features made by use of this simple pattern in accordance with the invention can be used as a nanoimprint lithography mold to rapidly and precisely replicate the pattern of complex features. Advantageously, the regularity of the resulting complex features can be further enhanced by smoothing in accordance with the self-perfection method.

It is to be understood that the above-described embodiments are illustrative of only a few of the many possible specific embodiments which can represent applications of the invention. For example, as is well-known in the art of nanoimprint lithography, a mold with projecting features can be used to replicate either a surface with corresponding recessed features or a surface with corresponding projecting features, depending on further processing. Numerous and varied other arrangements can be made by those skilled in the art without departing from the spirit and scope of the invention.

What is claimed is:

1. A method of imprinting an imprintable material comprising the steps of:
    fabricating a mold for duplication having a pattern of complex nanoscale features and pressing the mold into the imprintable material,
    the step of fabricating a mold comprising:
        providing a substrate; forming a pattern of simple features on the substrate surface;
        converting the simple features on the substrate surface into a pattern of nanoscale features having greater complexity than the pattern of simple features by a process comprising shadow deposition and material removal on the substrate surface, or two or more shadow depositions on the substrate surface.

2. The method of claim 1 wherein the pattern of simple nanoscale features comprise at least one pillar.

3. The method of claim 1 wherein the pattern of nanoscale features having greater complexity include split-ring, double split-ring or bow-tie cross sections.

4. The method of claim 1 wherein the shadow deposition comprises shadow evaporation.

5. The method of claim 1 wherein the pattern of simple nanoscale features comprises an array of square pillars and the shadow deposition comprises a plurality of shadow evaporations directed diagonally towards the pillar squares.

6. The method of claim 1 wherein the pattern of simple nanoscale features comprises an array of round pillars and converting the simple nanoscale features into a pattern of nanoscale features having greater complexity comprises applying a coating onto the simple nanoscale features of the substrate.

7. The method of claim 1 further comprising:
    providing a mold having a molding surface comprising a pattern of simple nanoscale features; and wherein forming the pattern of simple features on the substrate comprises imprinting the mold into the resist material.

8. The method of claim 1 wherein forming the pattern of simple nanoscale features comprises direct writing.

9. The method of claim 1 further comprising the step of smoothing the complex nanoscale features on the substrate surface.

10. The method of claim 1 wherein the step of material removal comprising etching or material lift off.

11. The method of claim 1 wherein the steps of forming the pattern of simple features and of converting the simple features to a pattern of nanoscale features having greater complexity are repeated to fabricate a final mold, wherein the pattern of nanoscale features having greater complexity defines the pattern of simple features for the next iteration.

12. The method of claim 1 wherein the step of forming the pattern of simple features is repeated using the pattern of nanoscale features having greater complexity form the previous iteration.

13. The method of claim 1 wherein said substrate is imprinted with a pattern prior to said step of forming said simple pattern.

14. The method of claim 13 wherein said imprinted pattern on said substrate is a nanoimprint pattern.

15. The method of claim 1 wherein each repetition of shadow deposition deposits a discrete layer of material onto said substrate.

16. The method of claim 15 wherein each repetition of said step of shadow deposition is performed at a different angles.

17. The method of claim 1 wherein said step of material removal is done by etching.

18. The method of claim 1 wherein said step of material removal comprises an anisotropic etching process.

19. The method of claim 1 wherein the step of forming the pattern of simple features comprises a lithography process.

20. The method of claim 1 wherein the step of forming the pattern of simple features comprises a nanoimprint process using a mold.

21. The method of claim 1 wherein the step of forming the pattern comprises a lithographic procedure selected from a set of lithographic procedures, including electron beam lithography, ion beam lithography, photolithography, interference lithography, and scanning electron lithography.

22. The method of claim 1 wherein the step of forming the pattern includes a material removal step of etching or material lift off.

23. The method of claim 1 wherein the simple pattern comprises at least one feature having a square shape, a rectangle shape, a triangle shape, a ring shape, or a split ring shape.

24. The method of claim 1 wherein said pattern of nanoscale features having greater complexity are configured for surface enhanced Raman scattering.

25. The method of claim 1 wherein said substrate comprises silicon or glass.

26. A method of imprinting an imprintable material comprising the steps of:

fabricating a final mold for duplication having a final pattern of complex nanoscale features and pressing the final mold into the imprintable material, the step of fabricating a final mold comprising:

providing a substrate;

forming a base feature pattern on the substrate with the lithography of an intermediate pattern forming mold;

converting the base features on the substrate surface into a pattern of nanoscale features having a greater complexity than said base feature pattern by a process comprising at least two shadow depositions or a shadow deposition and material removal on the substrate surface to complete a second pattern forming mold; and repeating the providing a substrate step and repeating the forming and converting steps utilizing the second pattern forming mold in place of the intermediate pattern forming mold thereby producing a final mold for duplication having a final pattern of complex nanoscale features.

* * * * *